(12) United States Patent
Eisenring

(10) Patent No.: US 7,895,721 B2
(45) Date of Patent: Mar. 1, 2011

(54) METHOD OF STORING ELECTRICITY IN QUANTUM BATTERIES

(76) Inventor: Rolf Eisenring, Pompano Beach, FL (US)

( * ) Notice: Subject to any disclaimer, the term of this patent is extended or adjusted under 35 U.S.C. 154(b) by 0 days.

(21) Appl. No.: 11/892,353

(22) Filed: Aug. 22, 2007

(65) Prior Publication Data
US 2008/0016681 A1 Jan. 24, 2008

Related U.S. Application Data

(62) Division of application No. 10/519,491, filed on Aug. 10, 2005, now abandoned.

(51) Int. Cl.
*H01G 7/00* (2006.01)
(52) U.S. Cl. .................. 29/25.41; 29/25.03; 29/25.42; 29/623.1; 361/311
(58) Field of Classification Search .............. 29/825, 29/830, 846–847, 25.35, 25.41, 25.01–25.03; 361/277–278, 281, 290, 283.1, 311, 321.5; 428/413
See application file for complete search history.

(56) References Cited

U.S. PATENT DOCUMENTS

| 5,705,259 | A | * | 1/1998 | Mrotek et al. | 428/209 |
|---|---|---|---|---|---|
| 5,710,436 | A | * | 1/1998 | Tanamoto et al. | 257/14 |
| 5,711,988 | A | * | 1/1998 | Tsai et al. | 427/80 |
| 5,800,575 | A | * | 9/1998 | Lucas | 29/25.42 |
| 6,066,540 | A | * | 5/2000 | Yeom et al. | 438/396 |
| 6,399,521 | B1 | * | 6/2002 | Zhang et al. | 438/785 |
| 6,544,651 | B2 | * | 4/2003 | Wong et al. | 428/413 |
| 7,031,136 | B2 | * | 4/2006 | Hunt et al. | 361/277 |
| 7,042,708 | B1 | * | 5/2006 | Borisenko et al. | 361/502 |
| 7,289,312 | B2 | * | 10/2007 | Duff, Jr. | 361/502 |
| 7,338,814 | B2 | * | 3/2008 | Tatsunari | 438/3 |
| 2002/0016396 | A1 | | 2/2002 | Wong et al. | 524/394 |
| 2004/0169992 | A1 | | 9/2004 | Hunt et al. | |
| 2009/0195961 | A1 | * | 8/2009 | Eisenring | 361/301.4 |

OTHER PUBLICATIONS

International Search Report.

* cited by examiner

*Primary Examiner* — Minh Trinh
(74) *Attorney, Agent, or Firm* — Nixon & Vanderhye PC

(57) ABSTRACT

A method with which Quantum Batteries (super capacitors) can be produced from materials which consist of chemically highly dipolar crystals in the form of nanometer-sized grains or layers that are embedded in electrically insulating matrix material or intermediate layers, and are applied to a compound foil or fixed flat base. The materials are assembled so as to form wound capacitors or flat capacitors which are able to store electrical energy in a range of up to 15 MJ/kg or more without any loss due to the effect of virtual photon resonance.

5 Claims, 1 Drawing Sheet

Fig. No. 1
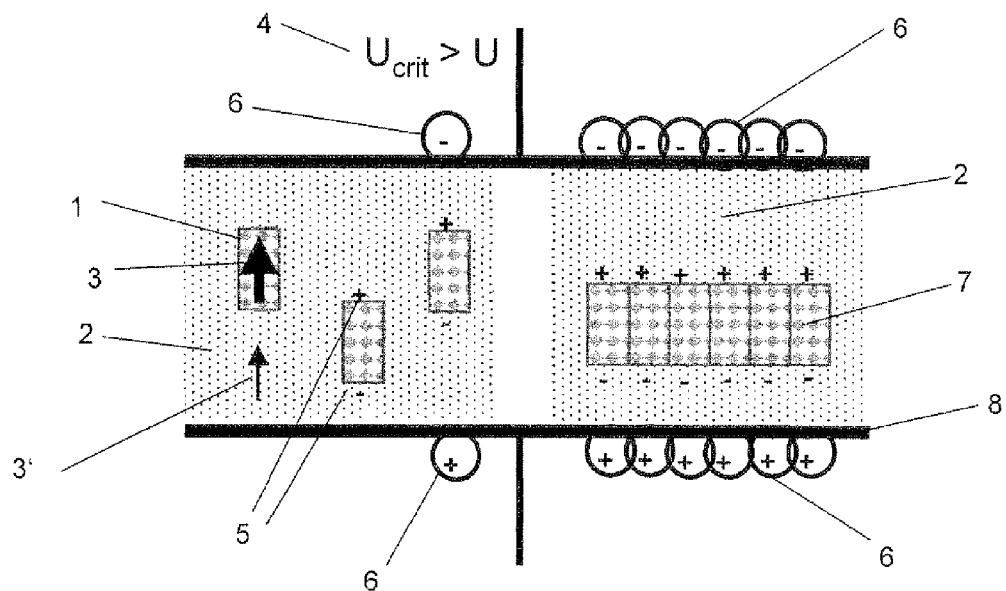
Fig. No. 2
Fig. No. 3
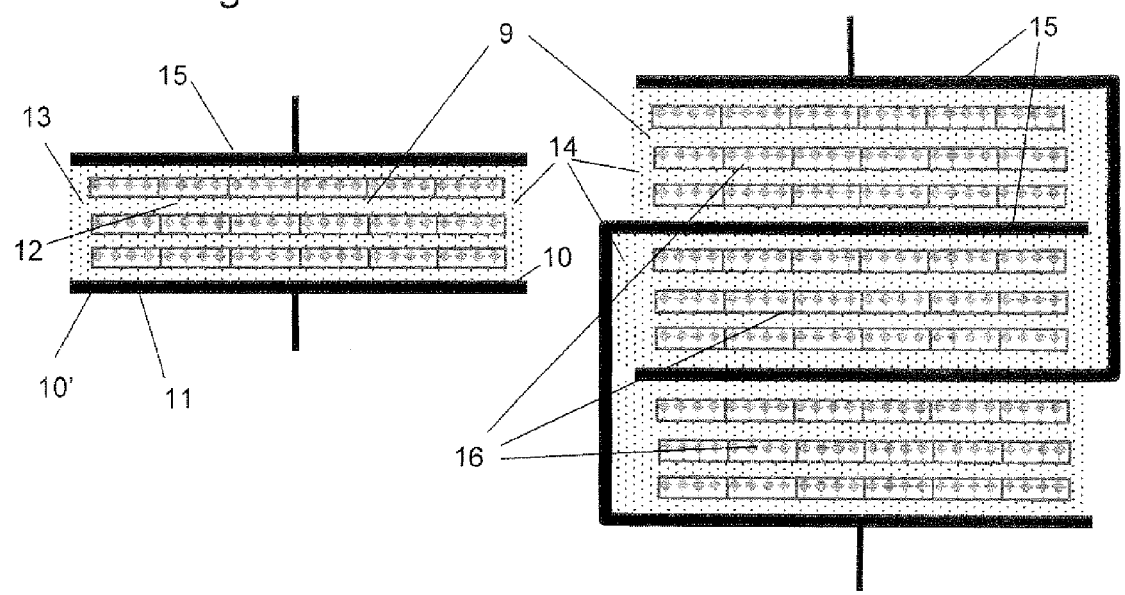

METHOD OF STORING ELECTRICITY IN QUANTUM BATTERIES

This application is a division of application Ser. No. 10/519,491, filed Aug. 10, 2005, now abandoned the entire content of which is hereby incorporated by reference in this application.

This invention relates to high density storage of electrical energy in a device composed of materials with special electrical properties forming a battery as a "super capacitor" or a so-called "Quantum Battery", for usage in stationary as well as mobile applications, and also in applications, where rapid loading and discharge of energy is required.

BACKGROUND OF THE INVENTION

The high specific weight when storing electrical energy in conventional batteries and also in capacitors is one of the major shortcomings for mobile applications. On the other hand, the much more advantageous direct storage of chemical energy in fossil fuels and its ease of utilization led to an unacceptable waste of irrecoverable natural reserves. Furthermore, the technical storage and discharge of electrical energy in, e.g., lead batteries, is bound to a high resistance, which results in high heat losses which, in turn, strongly limit loading and discharge speeds. Available "super capacitors" function on a different physical principle. They operate only on low voltages, are sensible to mechanical shocks, show some elevated resistances and have several orders of magnitude lower energy and power densities.

BRIEF SUMMARY OF THE INVENTION

The storage device in accordance with an exemplary, non-limiting embodiment of the invention, is independent from a stationary supply source and is therefore utilized to power electrical devices for mobile traffic (road vehicle, train, ship as well as aircraft), and is aimed as an energy substitute for fossil fuels. The high density resistance and substantially loss-free storage technology allows also the application in energy supply for household and the transport of energy gained through solar technology. The special materials also allow the manufacture of new types of electronic components. The extreme fast and loss-free discharge of the electrically stored energy make it even possible to use the device also as an explosive.

BRIEF DESCRIPTION OF THE DRAWINGS

The new device allows direct storage of electrical energy with a density in the same order of magnitude as energy that can be stored as chemical energy in fossil fuels. Densities in the range of 1 to over 15 MJ/kg can be reached. The special materials of the new storage device allow nearly unlimited loading and discharging cycles, and the material does not wear. During operation, the storage device does not show losses due to resistance. The device is substantially unaffected by mechanical shock or excessive accelerations as well as extreme temperatures. Also any positioning in space is irrelevant to its operation.

FIG. 1 schematically shows the charging process named "virtual photon resonance" where crystals either as single particles (1) or as particles aligned in solid layers (7) become stressed by a strong electric field (3) and the isolation material by a comparatively weaker field (3). At reaching of a critical voltage (4) the crystals as semiconductors become conductive (5) by taking up the required energy storing device similar to a capacitor.

FIG. 2 schematically shows how the super capacitor or Quantum Battery can be built as a flat device by depositing the crystal and isolation layers alternatively in a sandwich or layered structure (12) and where the overlapping isolation layers (13) provide fixation (14) such that the crystal layers do not delaminate when cooling down after annealing at high temperature.

FIG. 3 schematically shows how the super capacitor or Quantum Battery can be built by combination of multiple flat layers.

DETAILED DESCRIPTION OF THE INVENTION

The following description refers to FIG. 1. The invention is based on the physical effect that very small particles (1) of a strong dipolar crystal material such as TiO2 Rutile (strong electro negativity) embedded in an insulating matrix (2), e.g., SiO2 or polymer resin, and under the stress of a strong electrical field (3) and at a critical voltage (4) (loading condition) become conductive (5) (i.e., acts as a semiconductor) and thus take up energy which is then stored (6) in a similar way as for a normal plate capacitor. The storage device can be built for voltages from a few volts to thousands of volts. The storage capacity is only limited by the maximum possible physical mechanical dimensions.

The storage crystals such as TiO2, SrTiO3 or similar, either ground to grains or particles (1) of some nanometer (nm) size or as nm-thick layers (7) are applied together with an insulating medium on a carrier surface (8). There exists a particular prerequisite for a type of crystal, known as a "Rutile" crystal.

Two different processes are possible:
a) A mixture of ground crystal grains and polymer resin are first dispersed and the electrostatically sprayed on a compound film composed of a metal and a polymer foil, which is either continuously laid on a flat table. The isolated metal foil of the compounded film is the counter electrode. Due to the insulating resin and the compound film, the electrical charges arriving with the wet resin on the surface cannot flow to ground. These charges, together with the metal foil, create a very strong electrical field, which exerts by means of the capacitive effect, very strong surface forces. These surface forces cause geometrically exact forms. In addition, due to the strong surface forces, a high hydraulic pressure in the wet resin is applied so that the layers become air pore-free. Additionally, the strong electrostatic field causes a proper alignment of the dipoles. The resin in then cured by heat or radiation. Thereafter the layered film is cut and formed into a multi-layer capacitor. Finally, the metallic parts of the device are alternatively electrically connected forming the positive and negative poles of the storage device.
b) The following description refers to FIGS. 2 and 3. By means of Chemical Vapor Deposition (CVD) or Physical Vapor Deposition (PVD), several thin layers of the storage crystals, e.g., TiO2, are deposited alternatively together with insulation layers (9), e.g., SiO2, on a planar carrier surface (10) of a carrier 10' which itself is covered by a conductive material such as, e.g., platinum, forming the bottom electrode (11). Through proper annealing at a temperature of, e.g., 700° C., polycrystalline layers are achieved. After deposition of each resonance layer, it becomes a fully sandwich or layered-type structure (12), covered by an overlapping insulator layer (13) that also provides fixation (14). Thus, after the subsequent annealing process above 800° C. for achieving the Rutile phase, and when cooling down, the resonance layers do not delaminate even though they have strongly different thermal expansion coefficients. Finally, a metallic cover layer is placed forming the top electrode of the device (15). It is also possible to deposit several combinations of layers (16).

Eventually, the storage device will be coated by an isolating material and the electrodes connected to external clamps or through strips lines to the control logic.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A process for manufacturing super capacitors storing electrical energy in resonance excited, crystalline, chemically dipolar nano-particles separated by an electrically insulating material, comprising:

providing a carrier having a carrier surface, alternately depositing layers of nano-particles of a first composition and layers of insulating material of a second composition onto said carrier surface by chemical or physical vapor deposition in order to obtain a multi-layered structure, wherein the layers of insulating material, overlap the layers of nano-particles; and, annealing said multi-layered structure at a temperature of above 800° C. to achieve a Rutile type crystal phase, wherein the layers do not delaminate due to the different thermal expansion coefficients.

2. The process according to claim 1, wherein said nano-particles of said first composition are comprised of $TiO_2$.

3. The process according to claim 1, wherein said insulating material of said second composition is $SiO_2$.

4. The process according to claim 2, wherein said insulating material is $SiO_2$.

5. The process of claim 1, wherein the super capacitor is formed as a flat super capacitor.

* * * * *